(12) United States Patent
Choi et al.

(10) Patent No.: US 12,191,585 B2
(45) Date of Patent: Jan. 7, 2025

(54) ANTENNA PACKAGE AND IMAGE DISPLAY DEVICE INCLUDING THE SAME

(71) Applicants: DONGWOO FINE-CHEM CO., LTD., Jeollabuk-do (KR); POSTECH RESEARCH AND BUSINESS DEVELOPMENT FOUNDATION, Gyeongsangbuk-do (KR)

(72) Inventors: Byung Jin Choi, Incheon (KR); Ho Dong Yoon, Gyeonggido (KR); Won Hee Lee, Incheon (KR); Won Bin Hong, Seoul (KR)

(73) Assignees: DONGWOO FINE-CHEM CO., LTD., Jeollabuk-Do (KR); POSTECH RESEARCH AND BUSINESS DEVELOPMENT FOUNDATION, Gyeongsangbuk-Do (KR)

( * ) Notice: Subject to any disclaimer, the term of this patent is extended or adjusted under 35 U.S.C. 154(b) by 42 days.

(21) Appl. No.: 17/981,580

(22) Filed: Nov. 7, 2022

(65) Prior Publication Data
US 2023/0058014 A1 Feb. 23, 2023

Related U.S. Application Data

(63) Continuation of application No. PCT/KR2021/005637, filed on May 6, 2021.

(30) Foreign Application Priority Data

May 7, 2020 (KR) .......... 10-2020-0054546

(51) Int. Cl.
*H01Q 9/04* (2006.01)
*H01Q 1/24* (2006.01)
(Continued)

(52) U.S. Cl.
CPC ............. *H01Q 9/045* (2013.01); *H01Q 1/243* (2013.01); *H01Q 1/48* (2013.01); *H01Q 21/08* (2013.01)

(58) Field of Classification Search
CPC ........ H01Q 1/242; H01Q 1/243; H01Q 1/364; H01Q 1/48; H01Q 1/50; H01Q 1/521;
(Continued)

(56) References Cited

FOREIGN PATENT DOCUMENTS

| CN | 110729547 A | 1/2020 |
|---|---|---|
| CN | 215070413 U | 12/2021 |

(Continued)

OTHER PUBLICATIONS

International Search Report for PCT/KR2021/005637 mailed on Aug. 27, 2021.

*Primary Examiner* — Hoang V Nguyen
(74) *Attorney, Agent, or Firm* — The PL Law Group, PLLC

(57) ABSTRACT

An antenna package according to an embodiment includes an antenna unit, and a circuit board electrically connected to the antenna unit. The circuit board may include a core layer, a signal transmission wiring disposed on one surface of the core layer, the signal transmission wiring having one end portion connected to the antenna unit, a ground layer disposed on an opposite surface facing the one surface of the core layer, and a first via structure formed through the core layer and arranged around the one end portion of the signal transmission wiring to be in contact with the ground layer.

15 Claims, 6 Drawing Sheets

(51) Int. Cl.
*H01Q 1/48* (2006.01)
*H01Q 21/08* (2006.01)

(58) Field of Classification Search
CPC ........ H01Q 7/06; H01Q 9/0407; H01Q 9/045; H01Q 21/08
See application file for complete search history.

(56) References Cited

FOREIGN PATENT DOCUMENTS

| | | |
|---|---|---|
| EP | 1 686 651 A2 | 8/2006 |
| KR | 10-2009-0133072 A | 12/2009 |
| KR | 10-2013-0095451 A | 8/2013 |
| KR | 10-2016-0080444 A | 7/2016 |
| KR | 10-2018-0134528 A | 12/2018 |
| KR | 101940798 B1 * | 1/2019 ............... H01Q 1/38 |
| KR | 10-2020-0039321 A | 4/2020 |
| WO | WO 2019-146988 A1 | 8/2019 |
| WO | WO-2020009529 A1 * | 1/2020 ........... H01Q 1/2291 |

* cited by examiner

ANTENNA PACKAGE AND IMAGE DISPLAY DEVICE INCLUDING THE SAME

CROSS-REFERENCE TO RELATED APPLICATION AND CLAIM OF PRIORITY

The present application is a continuation of application to International Application No. PCT/KR2021/005637, filed on May 6, 2021 which claims priority to Korean Patent Application No. 10-2020-0054546 filed on May 7, 2020 in the Korean Intellectual Property Office (KIPO), the entire disclosures of which are incorporated by reference herein.

BACKGROUND

1. Field

The present invention relates to an antenna package and an image display device including the same. More particularly, the present invention relates to an antenna package including an antenna device and a circuit board and an image display device including the same.

2. Description of the Related Art

As information technologies have been developed, a wireless communication technology such as Wi-Fi, Bluetooth, etc., is combined with an image display device in, e.g., a smartphone form. In this case, an antenna may be combined with the image display device to provide a communication function.

As mobile communication technologies have been rapidly developed, an antenna capable of operating a high frequency or ultra-high frequency communication is needed in the image display device.

However, as a driving frequency of the antenna increases, a signal loss may also increase. Further, as a length of a transmission path increases, a degree of the signal loss may further increase.

Further, when an intermediate circuit structure such as a flexible printed circuit board (FPCB) is used to electrically connect a driving integrated circuit chip and the antenna for an antenna feeding/driving control, additional signal loss and signal disturbance may occur.

For example, radiation and impedance properties through radiation electrodes and/or pads included in the antenna may be disturbed by wirings or electrode patterns included in the FPCB, or the signal loss may also be caused due to a contact resistance.

Thus, an antenna design to stably implement radiation in a desired high-frequency band while being free from an influence of the intermediate circuit structure is needed. For example, Korean Patent Application Publication No. 2013-0095451 discloses an antenna integrated with a display panel.

SUMMARY

According to an aspect of the present invention, there is provided an antenna package having improved operational reliability and signaling efficiency.

According to an aspect of the present invention, there is provided an image display device including an antenna package with improved operational reliability and signaling efficiency.

(1) An antenna package, including: an antenna unit; and a circuit board electrically connected to the antenna unit, the circuit board including: a core layer; a signal transmission wiring disposed on one surface of the core layer, the signal transmission wiring having one end portion connected to the antenna unit; a ground layer disposed on an opposite surface facing the one surface of the core layer; and a first via structure formed through the core layer and arranged around the one end portion of the signal transmission wiring to be in contact with the ground layer.

(2) The antenna package of the above (1), wherein the circuit board further includes a bonding pattern disposed around the one end portion of the signal transmission wiring on the one surface of the core layer.

(3) The antenna package of the above (2), wherein the first via structure contacts the bonding pattern and the ground layer.

(4) The antenna package of the above (2), wherein the antenna unit includes a plurality of antenna units arranged in a width direction, and the signal transmission wiring includes a plurality of signal transmission wirings, each of which is connected to each of the antenna units.

(5) The antenna package of the above (4), wherein the bonding pattern includes a plurality of bonding patterns arranged along the width direction to be spaced apart from the signal transmission wirings, and the first via structure includes a plurality of first via structures in contact with the bonding patterns, and the plurality of first via structures are arranged along the width direction to form a first via row.

(6) The antenna package of the above (2), wherein the antenna unit includes a radiator, a transmission line extending from the radiator, a signal pad formed at a terminal end of the transmission line, and an antenna ground pad disposed around the signal pad, and the signal transmission wiring is electrically connected to the signal pad, and the bonding pattern is electrically connected to the antenna ground pad.

(7) The antenna package of the above (1), wherein the circuit board further includes second via structures arranged around the signal transmission wiring, and the second via structures are formed through the core layer to be in contact with the ground layer.

(8) The antenna package of the above (7), wherein the second via structures are arranged along an extension direction of the signal transmission wiring to form second via columns, and wherein the signal transmission wiring includes a plurality of signal transmission wirings and the second via columns are disposed between the plurality of signal transmission wirings.

(9) The antenna package of the above (1), wherein the circuit board further includes a ground pattern disposed around an opposite end portion of the signal transmission wiring on the one surface of the core layer.

(10) The antenna package of the above (9), wherein the circuit board further includes a third via structure formed through the core layer to be in contact with the ground pattern and the ground layer.

(11) The antenna package of the above (10), wherein the third via structure includes a plurality of third via structures arranged along an extension direction of the signal transmission wiring or the ground pattern to form a third via column.

(12) The antenna package of the above (11), wherein the third via column includes a plurality of third via columns, and the signal transmission wiring includes a plurality of signal transmission wirings, and the plurality of third via columns are disposed between the plurality of signal transmission wirings.

(13) The antenna package of the above (1), further including an antenna driving integrated circuit (IC) chip electrically connected to an opposite end portion of the signal transmission wiring.

(14) The antenna package of the above (13), further including an intermediate circuit board disposed between the opposite end portion of the signal transmission wiring and the antenna driving IC chip.

(15) The antenna package of the above (14), wherein the circuit board includes a flexible printed circuit board (FPCB), and the intermediate circuit board includes a rigid printed circuit board.

(16) An image display device including the antenna package according to embodiments as described above.

In an antenna package including an antenna device and a circuit board, the circuit board may include a ground layer and signal transmission wirings facing and overlapping each other. Accordingly, dielectric properties of the signal transmission wirings may be uniformly maintained. Additionally, generation of an electric field around the signal transmission wirings may be promoted by the ground layer, so that a feeding/signal transmission efficiency to an antenna unit may be improved.

In exemplary embodiments, a via structure connecting an antenna bonding pattern and the ground layer of the circuit board to each other may be formed. A noise absorption/blocking efficiency and an electric field generation may be further promoted by the via structure in a bonding region, thereby suppressing a signal/feeding loss and increasing an antenna signal/radiation efficiency.

DETAILED DESCRIPTION OF THE EMBODIMENTS

According to exemplary embodiments of the present invention, there is provided an antenna package in which an antenna unit, and a circuit board that may include a signal transmission wiring and a ground layer. Further, an image display device including the antenna package is also provided.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

The terms "first", "second", "upper", "lower", "top", "bottom", etc., used in this application are not intended to designate an absolute position, but to relatively distinguish between different elements and positions.

Figure 1:
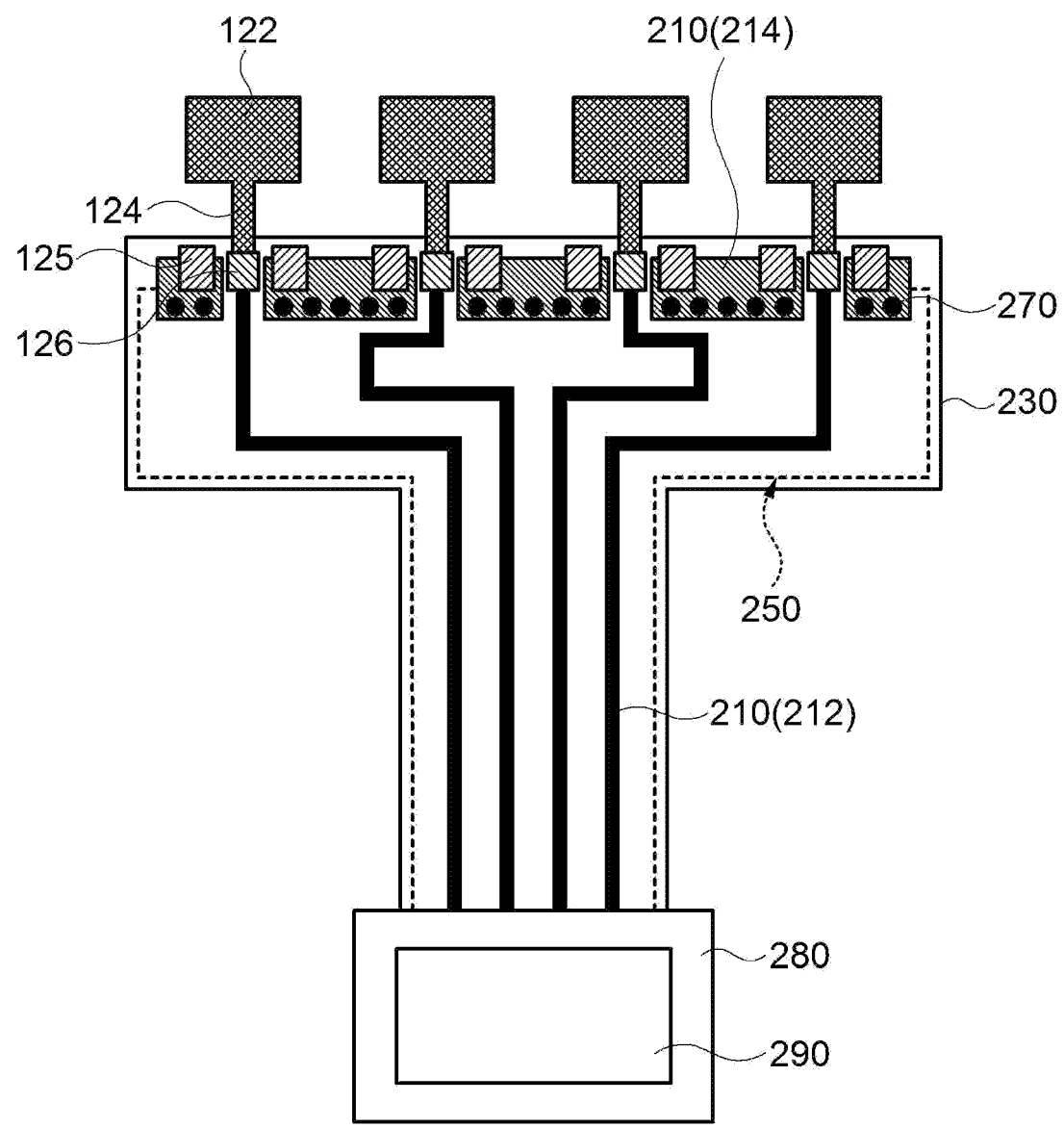
FIGS. 1 and 2 are a schematic top planar view and a schematic cross-sectional view, respectively, illustrating an antenna package in accordance with exemplary embodiments.
Figure 2:
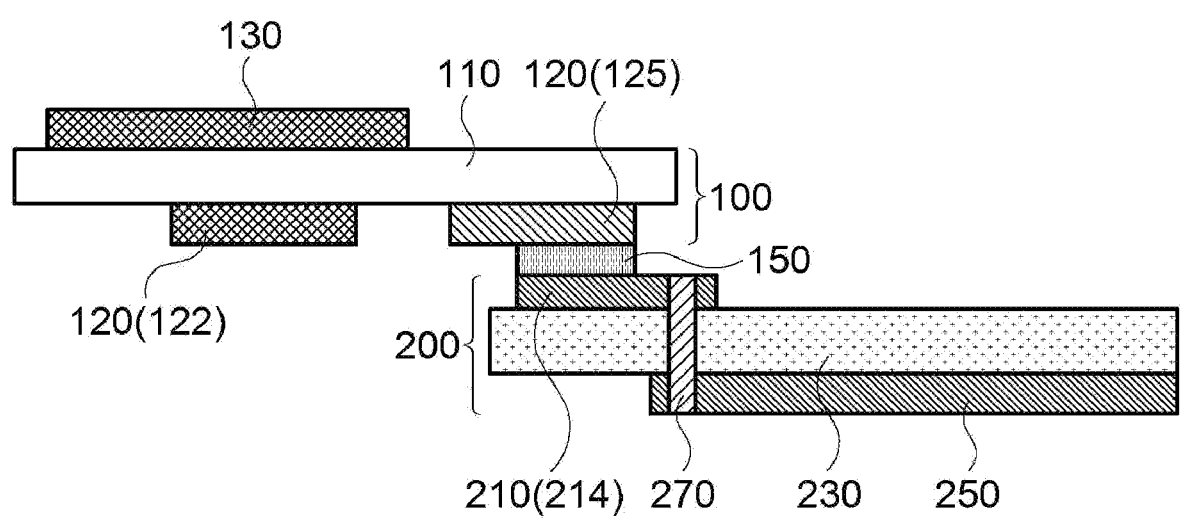

FIGS. 1 and 2 are a schematic top planar view and a schematic cross-sectional view, respectively, illustrating an antenna package in accordance with exemplary embodiments.

Referring to FIGS. 1 and 2, the antenna package may include an antenna device 100 and a circuit board 200. The circuit board 200 may include a core layer 230, a circuit wiring layer 210 and a ground layer 250, and the circuit wiring layer 210 and an antenna unit included in the antenna device 100 may be electrically connected to each other.

The antenna device 100 may include an antenna dielectric layer 110 and an antenna electrode layer 120 disposed on the antenna dielectric layer 110.

The antenna dielectric layer 110 may include, e.g., a transparent resin film such as a polyester-based resin such as polyethylene terephthalate, polyethylene isophthalate, polyethylene naphthalate and polybutylene terephthalate; a cellulose-based resin such as diacetyl cellulose and triacetyl cellulose; a polycarbonate-based resin; an acrylic resin such as polymethyl (meth)acrylate and polyethyl (meth)acrylate; a styrene-based resin such as polystyrene and an acrylonitrile-styrene copolymer; a polyolefin-based resin such as polyethylene, polypropylene, a cycloolefin or polyolefin having a norbornene structure and an ethylene-propylene copolymer; a vinyl chloride-based resin; an amide-based resin such as nylon and an aromatic polyamide; an imide-based resin; a polyethersulfone-based resin; a sulfone-based resin; a polyether ether ketone-based resin; a polyphenylene sulfide resin; a vinyl alcohol-based resin; a vinylidene chloride-based resin; a vinyl butyral-based resin; an allylate-based resin; a polyoxymethylene-based resin; an epoxy-based resin; a urethane or acrylic urethane-based resin; a silicone-based resin, etc. These may be used alone or in a combination of two or more thereof.

The antenna dielectric layer 110 may include an adhesive material such as an optically clear adhesive (OCA), an optically clear resin (OCR), or the like. In some embodiments, the antenna dielectric layer 110 may include an inorganic insulating material such as glass, silicon oxide, silicon nitride, silicon oxynitride, etc.

In some embodiments, a dielectric constant of the antenna dielectric layer 110 may be adjusted in a range from about 1.5 to about 12. When the dielectric constant exceeds about 12, a driving frequency may be excessively decreased, so that driving in a desired high frequency or ultrahigh frequency band may not be implemented.

The antenna electrode layer 120 may be formed on one surface of the antenna dielectric layer 110. As illustrated in FIG. 2, the antenna electrode layer 120 may include an antenna unit including a radiator 122.

In exemplary embodiments, the antenna unit may include an antenna pattern or a radiator capable of radiating at a high or ultra-high frequency band of 3G, 4G, 5G or more.

The antenna unit may further include a transmission line 124, a signal pad 126, and an antenna ground pad 125. The radiator 122 may have, e.g., a polygonal plate shape, and the transmission line 124 may extend from one side of the radiator 122 to be electrically connected to the signal pad 126. The transmission line 124 may be formed as a single member substantially integral with the radiator 122.

The signal pad 126 may be connected to an end portion of the transmission line 124. The signal pad 126 may be provided as a member substantially integral with the transmission line 124, and the end portion of the transmission line 124 may serve as the signal pad 126.

In exemplary embodiments, a pair of the antenna ground pads 125 may face each other with the transmission line 124 or the signal pad 126 interposed therebetween. The antenna ground pad 125 may be electrically and physically separated from the transmission line 124 and the signal pad 126.

In exemplary embodiments, a vertical radiation (e.g., a radiation in a thickness direction of the antenna device 100) may be substantially implemented through the radiator 122. Additionally, the antenna ground pads 125 may face each other and may be adjacent to the radiator 122, so that a horizontal radiation may be implemented by the antenna ground pad 125.

The antenna unit may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca) or an alloy containing at least one of the metals. These may be used alone or in combination thereof.

In an embodiment, the antenna unit may include silver (Ag) or a silver alloy (e.g., silver-palladium-copper (APC)), or copper (Cu) or a copper alloy (e.g., a copper-calcium (CuCa)) to implement a low resistance and a fine line width pattern.

The antenna unit may include a transparent conductive oxide such indium tin oxide (ITO), indium zinc oxide (IZO), zinc oxide (ZnOx), indium zinc tin oxide (IZTO), etc.

In some embodiments, the antenna unit may include a stacked structure of a transparent conductive oxide layer and a metal layer. For example, the antenna unit may include a double-layered structure of a transparent conductive oxide layer-metal layer, or a triple-layered structure of a transparent conductive oxide layer-metal layer-transparent conductive oxide layer. In this case, flexible property may be improved by the metal layer, and a signal transmission speed may also be improved by a low resistance of the metal layer. Corrosive resistance and transparency may be improved by the transparent conductive oxide layer.

In some embodiments, the radiator 122 and the transmission line 124 may include a mesh-pattern structure to improve transmittance. In this case, a dummy mesh pattern (not illustrated) may be formed around the radiator 122 and the transmission line 124.

The signal pad 126 and the antenna ground pad 125 may be solid patterns formed of the above-described metal or alloy in consideration of reduction of a feeding resistance, improvement of noise absorption efficiency, horizontal radiation properties, etc.

In some embodiments, at least a portion of the antenna ground pad 125 may have a solid pattern structure. In an embodiment, a portion of the antenna ground pad 125 adjacent to the radiator may have a mesh-pattern structure. For example, the antenna ground pad 125 may additionally extend toward the radiator 122 to be disposed in a display area of an image display device together with the radiator 122.

In this case, a portion of the antenna ground pad 125 disposed in the display area may have the mesh-pattern structure.

In some embodiments, an antenna ground layer 130 may be disposed on an opposite surface facing the one surface of the antenna dielectric layer 110. The antenna ground layer 130 may be disposed to face the radiator 122 with the antenna dielectric layer 110 interposed therebetween. Accordingly, a vertical radiation through the radiator 122 may be promoted.

As illustrated in FIG. 2, the antenna ground layer 130 may overlap a portion of the antenna electrode layer 120 in a thickness direction. For example, the antenna ground layer 130 may not overlap the antenna ground pad 125 in a planar view. Accordingly, efficiency or concentration of the horizontal radiation by the antenna ground pad 125 may be improved.

In an embodiment, a conductive member of a display device to which the antenna package is applied may serve as the antenna ground layer 130.

The conductive member may include, e.g., a gate electrode of a thin film transistor (TFT) included in a display panel, various wirings such as scan lines or data lines or various electrodes such as pixel electrodes or common electrodes.

In an embodiment, a metallic member such as a SUS plate, a sensor member such as a digitizer, a heat dissipation sheet, etc., disposed at a rear portion of the display device may serve as the antenna ground layer 130.

The circuit board 200 may be electrically connected to the antenna device 100 via the signal pad 126 of the antenna unit. In exemplary embodiments, the circuit board 200 may be a flexible printed circuit board (FPCB).

The circuit board 200 may include the core layer 230, the circuit wiring layer 210 and the ground layer 250.

The core layer 230 may include, e.g., a flexible resin such as polyimide resin, Modified Polyimide (MPI), epoxy resin, polyester, cycloolefin polymer (COP), liquid crystal polymer (LCP), or the like.

The circuit wiring layer 210 may be formed on one surface of the core layer 230 (a top surface of the core layer 230 illustrated in FIG. 2), and may include a signal transmission wiring 212 and a bonding pattern 214.

The signal transmission wiring 212 may be electrically connected to the signal pad 126 of the antenna unit. As illustrated in FIG. 1, a plurality of the antenna units may be arranged along a width direction, and a plurality of the signal transmission wirings 212 may each be electrically connected to each of the signal pads 126 of the antenna unit.

The bonding pattern 214 may be electrically connected to the antenna ground pad 125 of the antenna unit. For example, a pair of the bonding patterns 214 may face each other with one end portion of the signal transmission wiring 212 interposed therebetween, and may be electrically connected to each antenna ground pad 125.

In some embodiments, the bonding pattern 214 may overlap the antenna ground pads 125 included in different antenna units in a planar view (e.g., two neighboring antenna ground pads 125).

As illustrated in FIG. 2, the circuit wiring layer 210 and the antenna electrode layer 120 may be bonded to each other through a conductive intermediate structure 150. For example, the conductive intermediate structure 150 may include an anisotropic conductive film (ACF).

In this case, the conductive intermediate structure 150 may be inserted into a region where the circuit board 200 and the antenna device 100 overlap each other, and the circuit board 200 and the antenna element 100 may be heat-pressed to each other.

Accordingly, the signal transmission wiring 212 and the signal pad 126 may be electrically connected to each other through the conductive intermediate structure 150. The bonding pattern 214 and the antenna ground pad 125 may also be electrically connected to each other through the conductive intermediate structure 150.

As illustrated in FIG. 1, the antenna ground pad 125 and the bonding pattern 214 may partially overlay each other in a planar view. The bonding pattern 214 may serve as a bonding pad to improve a bonding adhesion through the conductive intermediate structure 150. Additionally, the bonding pattern 214 may serve as a ground pattern for shielding/absorbing a noise around the signal transmission line 212. The bonding pattern 214 may have a floating pattern or an island pattern shape disposed around the signal transmission wiring in the bonding region.

The term "bonding pattern" as used herein refers to a conductive structure for the bonding with the antenna ground pad 125 having a specific shape without a particular limitation, and is used to encompass structures formed by various processes such as a plating process, a deposition process, an etching process, etc.

The ground layer 250 may be formed on an opposite surface facing the one surface of the core layer 230 (e.g., a bottom surface of the core layer 230 in FIG. 2).

In exemplary embodiments, the ground layer 250 may overlap the bonding patterns 214 and the signal transmission wiring 212 in a thickness direction. The ground layer 250 may continuously extend to commonly overlap the signal transmission wirings 212 and the bonding patterns 214 included in the circuit board 200.

The ground layer 250 may commonly overlap and face the signal transmission wirings 212, so that dielectric properties of the core layer 230 with respect to the signal transmission wiring 212 may be uniformly maintained. Additionally, generation of an electric field around the signal transmission wiring 212 may be promoted by the ground layer 250, so that feeding/signal transmission efficiency to the antenna unit may be improved.

The ground layer 250 may serve as a blocking layer that may shield a noise input toward the signal transmission wiring 212.

In exemplary embodiments, the ground layer 250 and the bonding pattern 214 may be electrically connected to each other through a via structure 270. The via structure 270 may be formed through the core layer 230 to electrically connect the ground layer 250 and the bonding pattern 214 to each other.

The ground layer 250 and the bonding pattern 214 may be connected to each other through the via structure 270, so that the noise absorption/blocking efficiency in the bonding region may be enhanced, and reliability of feeding/signal transmission to the antenna device 100 may be improved.

Further, the via structures 270 may be distributed around the bonding region, generation of an electric field in an area adjacent to the antenna unit may be further promoted, thereby suppressing a signal/feeding loss and increasing an antenna signal/radiation efficiency.

For example, a through hole may be formed commonly through the bonding pattern 214, the core layer 230 and the ground layer 250. The via structure 270 may be formed by filling the through hole with a conductive material by a plating process or the like.

As illustrated in FIG. 1, two or more via structures 270 may be connected to one bonding pattern 214, and a plurality of via structures 270 may be arranged along a width direction in the bonding region to form a via row. Accordingly, generation of the electric field in the bonding region may be further promoted.

The antenna package may include an antenna driving integrated circuit (IC) chip 290. The feeding/signal transmission to the antenna unit through the signal transmission wiring 212 may be controlled by the antenna driving IC chip 290.

For example, an intermediate circuit board 280 may be disposed between an opposite end portion of the circuit board 200 and the antenna driving IC chip 290 to electrically connect the circuit board 200 and the antenna driving IC chip 290 with each other. The intermediate circuit board 280 may be, e.g., a rigid printed circuit board. For example, the intermediate circuit board 280 may include an intermediate circuit pattern formed in a prepreg substrate.

The signal transmission wiring 212, the bonding pattern 214, the via structure 270 and the ground layer 250 described above may include a low-resistance conductive material such as a metal or an alloy.

Figure 3:
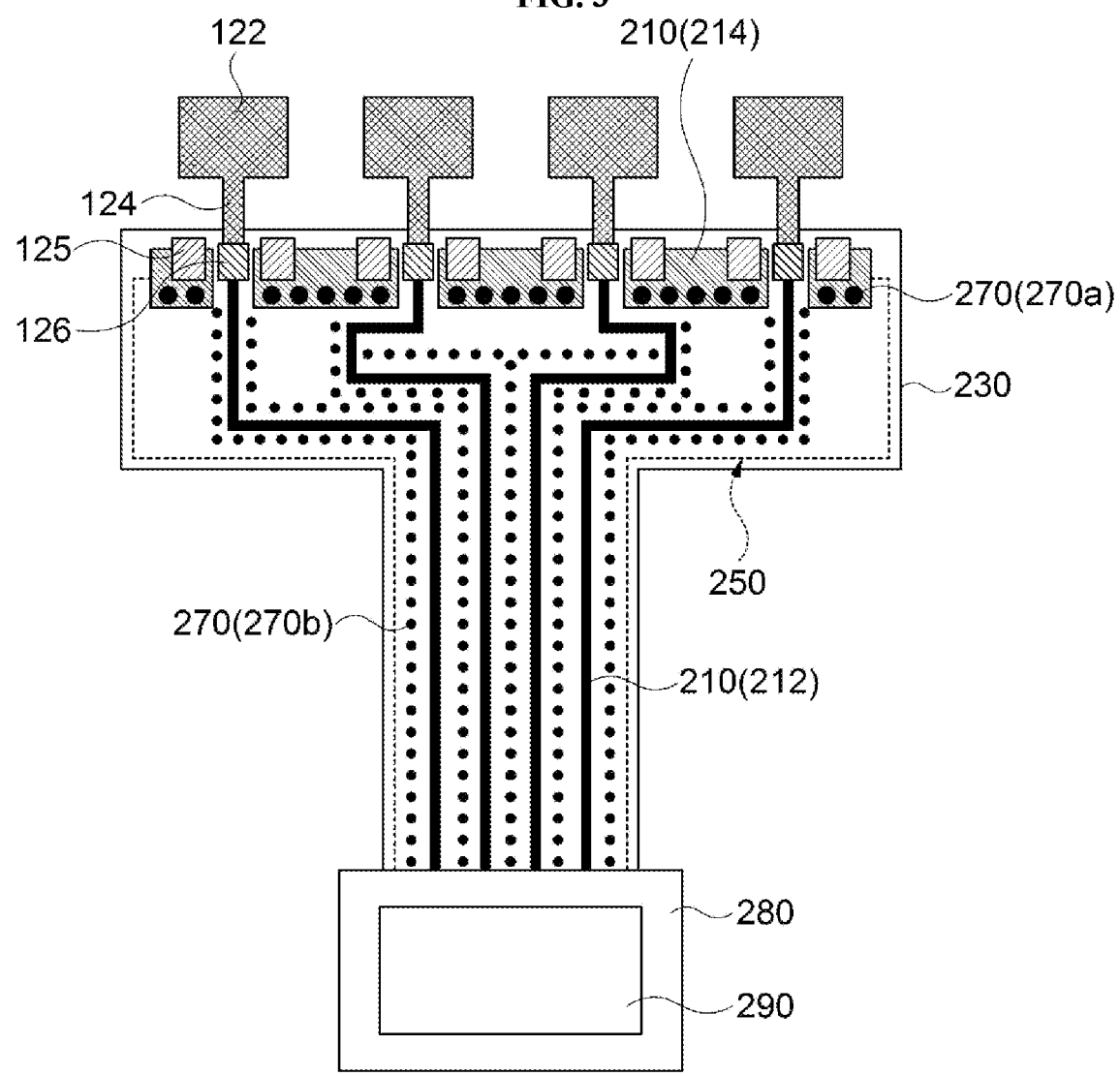
FIG. 3 is a schematic top planar view illustrating an antenna package in accordance with exemplary embodiments.

FIG. 3 is a schematic top planar view illustrating an antenna package in accordance with exemplary embodiments.

Referring to FIG. 3, the via structures 270 may include first via structures 270a and second via structures 270b. As described above, the first via structures 270a may contact the ground layer 250 and the bonding pattern 214 within the bonding region or around the bonding region.

The second via structures 270b may be arranged around the signal transmission wirings 212. In exemplary embodiments, the second via structures 270b may be spaced apart or separated from the signal transmission wiring 212 and may be continuously arranged along a profile of the signal transmission wiring 212. The second via structure 270b may penetrate through the core layer 230 and may contact the ground layer 250.

For example, the second via structures 270b may be arranged in a direction substantially parallel to the signal transmission wiring 212 or along an extension direction of the signal transmission wiring 212.

As illustrated in FIG. 3, the first via structures 270a may be arranged in a width direction to form a first via row. The second via structures 270b may be continuously arranged along the signal transmission wiring 212 to form a second via column. For example, a plurality of the second via columns may be arranged along the width direction. The second via column may be disposed between adjacent signal transmission wirings 212.

According to the above-described exemplary embodiments, the second via structures 270b may be formed around the signal transmission wiring 212, so that a mutual interference/noise between the signal transmission wirings 212 may be shielded, and thus independence/reliability between the antenna units may be improved.

Further, the generation of the electric field through the signal transmission wiring 212 may be additionally promoted by the second via structures 270b, so that a feeding/signal directivity toward the antenna unit may be improved.

Figure 4:
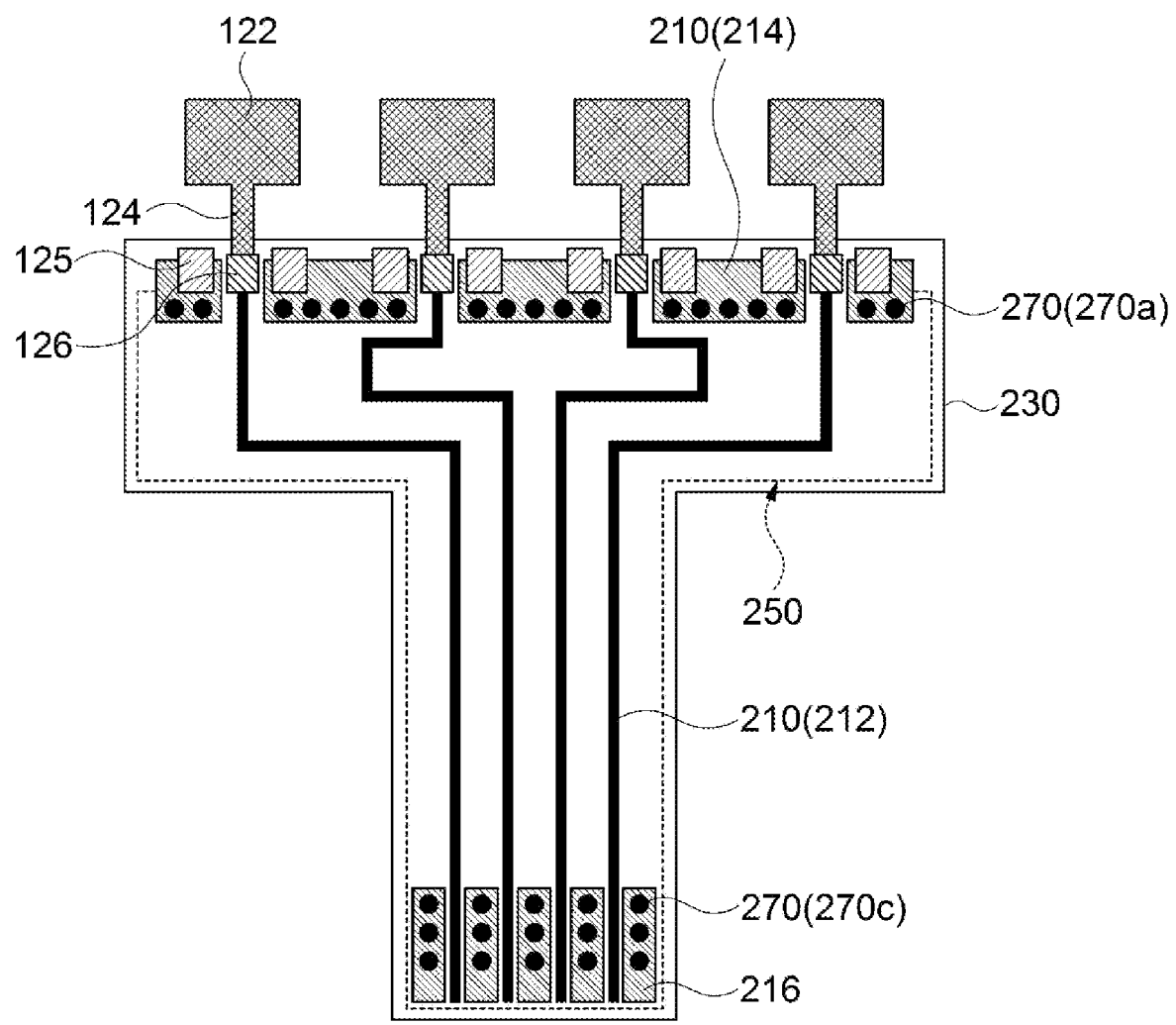
FIGS. 4 and 5 are schematic top planar views illustrating antenna packages in accordance with exemplary embodiments.
Figure 5:
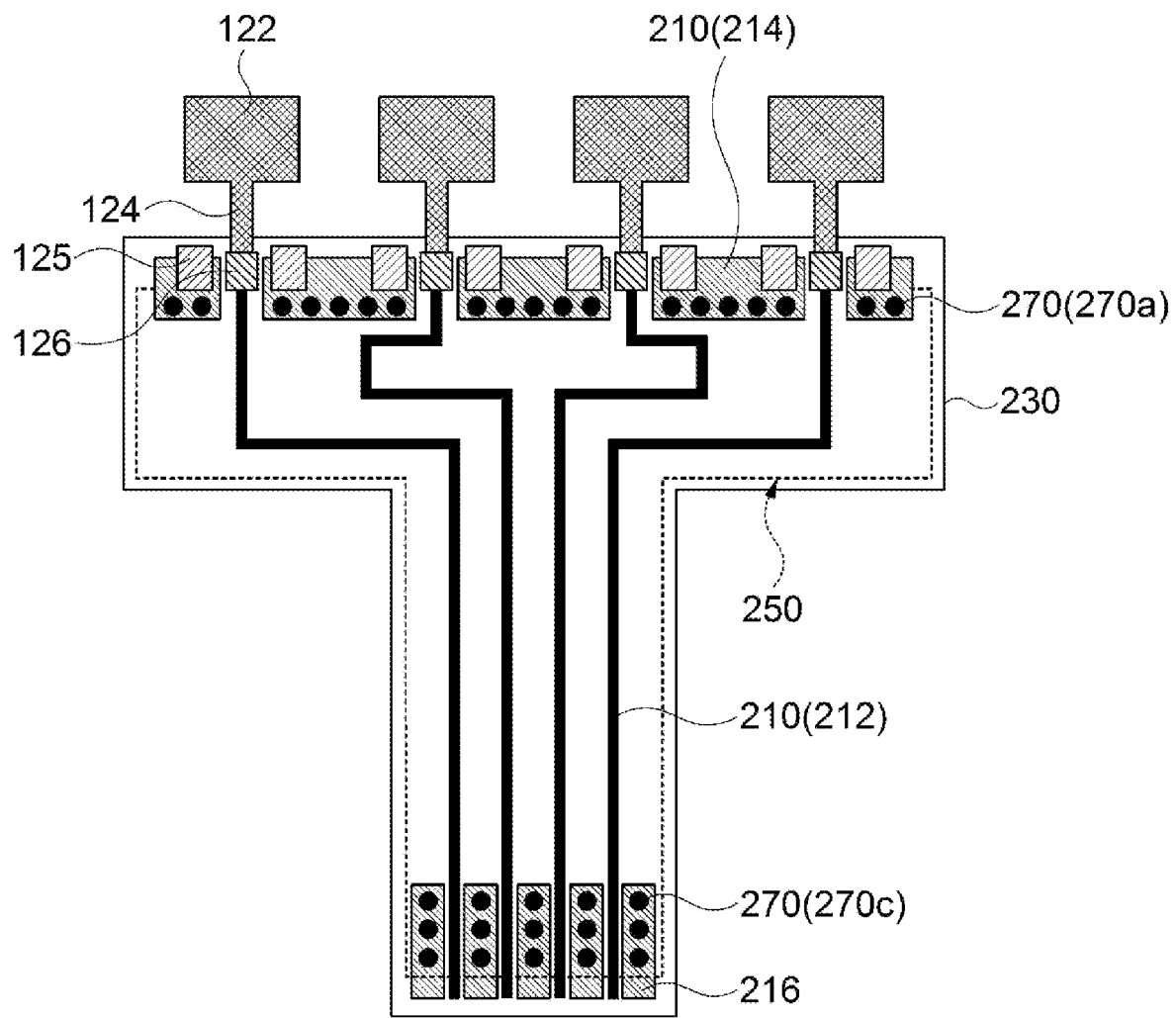

FIGS. 4 and 5 are schematic top planar views illustrating antenna packages in accordance with exemplary embodiments. Detailed descriptions of elements and/or structures substantially the same as or similar to those described with reference to FIGS. 1 and 2 are omitted.

Referring to FIG. 4, as described with reference to FIG. 1, one end portion of the circuit board 200 may be bonded to the antenna units, and an opposite end portion of the circuit board 200 may be electrically connected to the antenna driving IC chip 290. For example, the opposite end portion of the circuit board 200 may include a chip mounting region coupled to the antenna driving IC chip 290.

The circuit wiring layer 210 of the circuit board 200 may further include a ground pattern 216 disposed around end portions of the signal transmission wirings 212. The ground pattern 216 may be also disposed between the adjacent signal transmission wirings 212 to absorb or shield a signal noise in the chip mounting region.

In exemplary embodiments, the via structures 270 may further include a third via structure 270c. The third via structure 270c may be formed through the core layer 230, and may contact the ground pattern 216 and the ground layer 250.

The via structures 270c may be arranged in the chip mounting region or around the chip mounting region, and thus generation of an electric field in an area adjacent to the antenna driving IC chip 290 may be promoted. Accordingly, the electric field generation and directivity may be improved at the one end portion and the opposite end portion of the circuit board 200 may be improved by the first via structures 270a and the third via structures 270c, respectively, thereby improving an overall signal efficiency of the antenna package.

In some embodiments, two or more third via structures 270c may be formed on one ground pattern 216. For example, two or more third via structures 270c may be arranged along the extending direction of the signal transmission wiring 212 or the ground pattern 216 to form a third via column. Additionally, a plurality of the third via columns may be arranged around an end portion of the signal transmission wiring 212 along the width direction.

The ground layer 250 at the opposite end portion of the circuit board 200 may substantially entirely cover the ground pattern 216 in a planar view.

Referring to FIG. 5, the ground layer 250 may not overlap an end portion of the ground pattern 216 in a planar view. For example, the ground pattern 216 may protrude from the ground layer 250 in the planar view. In this case, the feeding/signal transmission generated from the antenna driving IC chip 290 may be prevented from being partially disturbed by the ground layer 250.

Figure 6:
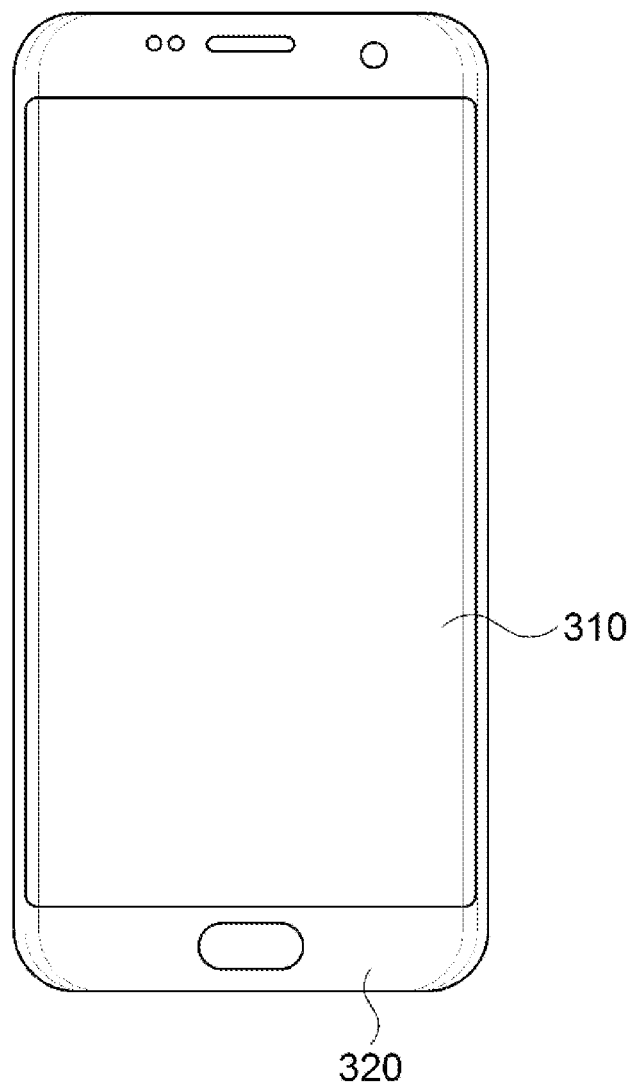
FIG. 6 is a schematic top planar view illustrating an image display device in accordance with exemplary embodiments.

FIG. 6 is a schematic top planar view illustrating an image display device in accordance with exemplary embodiments.

Referring to FIG. 6, the image display device 300 may be fabricated in the form of, e.g., a smart phone, and FIG. 6 shows a front face portion or a window surface of the image display device 300. The front face portion of the image display device 300 may include a display area 310 and a peripheral area 320. The peripheral area 320 may correspond to, e.g., a light-shielding portion or a bezel portion of an image display device.

The antenna device 100 included in the above-described antenna package may be disposed toward the front face portion of the image display device 300, and may be disposed on, e.g., a display panel. In an embodiment, the radiator 122 may be at least partially superimposed over the display area 310 in a planar view.

In this case, the radiator 122 may have a mesh-pattern structure, and a decrease in transmittance due to the radiator 122 may be prevented. The antenna driving IC chip 280 included in the antenna package may be disposed in the peripheral area 320 to prevent an image quality from being degraded in the display area 310.

In some embodiments, the antenna package may be bent by the circuit board 200 so that, e.g., the intermediate circuit board 280 and the antenna driving IC chip 290 may be disposed at a rear portion of the image display device 300.

As described above, a high efficiency antenna radiation with suppressed signal loss may be implemented using the construction of the ground layer 250 and the via structure 270 of the circuit board 200 while improving a signal reliability from the antenna driving IC chip 290.

What is claimed is:

1. An antenna package, comprising:
   an antenna unit; and
   a circuit board electrically connected to the antenna unit, the circuit board comprising:
   a core layer;
   a signal transmission wiring disposed on one surface of the core layer, the signal transmission wiring having one end portion connected to the antenna unit;
   a ground layer disposed on an opposite surface facing the one surface of the core layer;
   a first via structure formed through the core layer and arranged around the one end portion of the signal transmission wiring to be in contact with the ground layer; and
   a ground pattern disposed around an opposite end portion of the signal transmission wiring on the one surface of the core layer.

2. The antenna package of claim 1, wherein the circuit board further comprises a bonding pattern disposed around the one end portion of the signal transmission wiring on the one surface of the core layer.

3. The antenna package of claim 2, wherein the first via structure contacts the bonding pattern and the ground layer.

4. The antenna package of claim 2, wherein the antenna unit comprises a plurality of antenna units arranged in a width direction, and the signal transmission wiring comprises a plurality of signal transmission wirings, each of which is connected to each of the antenna units.

5. The antenna package of claim 4, wherein the bonding pattern comprises a plurality of bonding patterns arranged along the width direction to be spaced apart from the signal transmission wirings; and
   the first via structure comprises a plurality of first via structures in contact with the bonding patterns, and the plurality of first via structures are arranged along the width direction to form a first via row.

6. The antenna package of claim 2, wherein the antenna unit comprises a radiator, a transmission line extending from the radiator, a signal pad formed at a terminal end of the transmission line, and an antenna ground pad disposed around the signal pad; and
   the signal transmission wiring is electrically connected to the signal pad, and the bonding pattern is electrically connected to the antenna ground pad.

7. The antenna package of claim 1, wherein the circuit board further comprises second via structures arranged around the signal transmission wiring, and the second via structures are formed through the core layer to be in contact with the ground layer.

8. The antenna package of claim 7, wherein the second via structures are arranged along an extension direction of the signal transmission wiring to form second via columns, and
   wherein the signal transmission wiring comprises a plurality of signal transmission wirings and the second via columns are disposed between the plurality of signal transmission wirings.

9. The antenna package of claim 1, wherein the circuit board further comprises a third via structure formed through the core layer to be in contact with the ground pattern and the ground layer.

10. The antenna package of claim 9, wherein the third via structure comprises a plurality of third via structures arranged along an extension direction of the signal transmission wiring or the ground pattern to form a third via column.

11. The antenna package of claim 10, wherein the third via column comprises a plurality of third via columns, and the signal transmission wiring comprises a plurality of signal transmission wirings; and
   the plurality of third via columns are disposed between the plurality of signal transmission wirings.

12. The antenna package of claim 1, further comprising an antenna driving integrated circuit chip electrically connected to an opposite end portion of the signal transmission wiring.

13. The antenna package of claim 12, further comprising an intermediate circuit board disposed between the opposite end portion of the signal transmission wiring and the antenna driving integrated circuit chip.

14. The antenna package of claim 13, wherein the circuit board includes a flexible printed circuit board, and the intermediate circuit board includes a rigid printed circuit board.

15. An image display device comprising the antenna package of claim 1.

\* \* \* \* \*